United States Patent [19]

Murphy et al.

[11] Patent Number: 5,455,527
[45] Date of Patent: Oct. 3, 1995

[54] CMOS BUFFER CIRCUIT WITH CONTROLLED CURRENT SOURCE

[75] Inventors: Brian Murphy, Brombach; Martin Zibert, Heufeld, both of Germany

[73] Assignee: Siemens Aktiengesellshaft, Munich, Germany

[21] Appl. No.: 123,647

[22] Filed: Sep. 17, 1993

[30] Foreign Application Priority Data

Sep. 18, 1992 [EP] European Pat. Off. ............ 92116035

[51] Int. Cl.⁶ ..................... H03K 19/00; H03K 19/0175
[52] U.S. Cl. ..................... 326/83; 326/58; 326/34
[58] Field of Search ..................... 307/475, 473, 307/451, 443, 448, 481; 326/83, 87, 58, 121, 99, 34, 31

[56] References Cited

U.S. PATENT DOCUMENTS

| | | | |
|---|---|---|---|
| H802 | 7/1990 | Hisano | 307/448 |
| 4,037,114 | 7/1977 | Stewart et al. | 307/473 |
| 4,178,620 | 12/1979 | Yu | 307/473 |
| 4,584,492 | 4/1986 | Sharp | 307/475 |
| 4,709,162 | 11/1987 | Braceras et al. | 307/475 |
| 4,746,817 | 5/1988 | Banker et al. | 307/443 |
| 5,019,725 | 5/1991 | Yoshino | 307/443 |
| 5,036,227 | 7/1991 | Jo et al. | 307/451 |
| 5,051,625 | 9/1991 | Ikeda et al. | 307/473 |
| 5,194,764 | 3/1993 | Yano et al. | 307/475 |
| 5,229,659 | 7/1993 | Sandju | 307/448 |
| 5,268,599 | 12/1993 | Matsui | 307/475 |

FOREIGN PATENT DOCUMENTS

| | | |
|---|---|---|
| 0437039 | 7/1991 | European Pat. Off. . |
| 54-69947 | 5/1979 | Japan . |
| 58-207728 | 12/1983 | Japan . |
| 2135915 | 5/1990 | Japan . |
| 2195718 | 8/1990 | Japan . |
| 4134923 | 5/1992 | Japan . |

Primary Examiner—Edward P. Westin
Assistant Examiner—Richard Roseen
Attorney, Agent, or Firm—Herbert L. Lerner; Laurence A. Greenberg

[57] ABSTRACT

An integrated buffer circuit configuration has two inverters which are mutually connected in series. A circuit node lies between the two inverters. At least the first inverter is a CMOS inverter for an input signal IN. The CMOS inverter has an n-channel transistor which is connected to a first supply potential. The source of a p-channel transistor is connected with a constant current source. A first enable transistor is connected between the n-channel transistor of the first inverter and the circuit node. A second enable transistor is connected in parallel to the configuration formed by the constant current source and the p-channel transistor of the first inverter. The gates of the enable transistors are connected with the enable input of the buffer circuit. An enable signal present at the enable input makes it possible to deactivate the buffer circuit in the case of disturbances with a known course over time. A MOS-transistor may function as the constant current source. The MOS-transistor is then connected to a second supply potential and its gate lies at reference potential with a value with always has a constant difference with respect to the second supply potential. During operation, the MOS-transistor is conducting.

31 Claims, 6 Drawing Sheets

CMOS BUFFER CIRCUIT WITH CONTROLLED CURRENT SOURCE

BACKGROUND OF THE INVENTION

1. Field of the Invention

The invention relates to an integrated buffer circuit with an inverter and at least one constant current source (I).

Buffer circuits are often needed in integrated circuits, for example in order to adapt the input signals at the circuits to internally required signal properties (such as specifically required signal levels), or to adapt output signals of circuits to further circuits which receive their output signals. One common disadvantage of buffer circuits is their sensitivity to interference (such as noise) on the lines for the supply voltage. Moreover, their function is highly dependent on voltage fluctuations that might occur in the supply voltage. This is especially true if the buffer circuit is intended to convert signals with TTL levels into signals with CMOS levels (TTL levels: 0 V and 2.4 V; CMOS levels, usually 0 V and 4–6 V, typically 5 V).

2. Description of the Related Art

One buffer circuit of this genus is known from Patent Abstracts of Japan, Vol. 8, No. 53 (E-231) (1490), Mar. 9, 1984, pertaining to JP-A 58-207728 (A). Although the constant current source there already effects some reduction in the aforementioned sensitivity to interference, it does not do so to the extent often desired.

SUMMARY OF THE INVENTION

It is accordingly an object of the invention to provide an integrated buffer circuit, which overcomes the hereinafore-mentioned disadvantages of the heretofore-known devices of this general type and which is largely independent of interference in its input signal and on the lines for the supply voltage. It should also be as insensitive as possible to fluctuations in the supply voltage. Moreover, it should be suitable for both input signals with TTL levels and those with CMOS levels, and its output signal in each case should have the CMOS levels.

With the foregoing and other objects in view there is provided, in accordance with the invention, an integrated buffer circuit, comprising:

a first inverter having an input for receiving an input signal, and a constant current source;

a second inverter connected in series with the first inverter, the second inverter having an output issuing an output signal of the buffer circuit, and a circuit node connected between the first and second inverters;

the first inverter being a CMOS-inverter including first and second transistors, the first and second transistors being connected in series across the circuit node and being of a mutually opposite channel type;

the first and second transistors of the first inverter having electrically connected gates forming the input of the first inverter;

the first transistor of the first inverter having a source connected to a first supply potential;

the second transistor of the first inverter having a source connected to the constant current source;

the first transistor having a drain; a first enable transistor having a current-carrying path connected between the drain of the first transistor and the circuit node;

a second enable transistor having a current-carrying path connected in parallel to a path formed by the constant current source and the second transistor of the first inverter; and an enable input of the buffer circuit, the gates of the first and second enable transistors being connected to the enable input.

In accordance with an added feature of the invention, the constant current source includes an MOS-transistor connected between the source of the second transistor of the first inverter and a second supply potential, the MOS-transistor being electrically conductive during an operation of the buffer circuit and having a gate receiving a reference potential during an operation of the buffer circuit, the reference potential having a value different from the second supply potential by a constant amount.

In accordance with another feature of the invention, the MOS-transistor is a p-channel MOS-transistor.

In accordance with an additional feature of the invention, the integrated buffer circuit includes means for generating the reference potential, the generating means comprising resistance means and diode means; the diode means being connected between the gate of the MOS-transistor and the second supply potential; and the resistance means being connected between the gate of the MOS-transistor and the first supply potential.

In accordance with a further feature of the invention, the integrated buffer circuit includes means for generating the reference potential, the generating means including resistance means and diode means; the resistance means being a potentiometer-type resistor having a first resistor part and a second resistor part; the first and second resistor parts, at ends facing one another, being connected to the gate of the MOS-transistor and forming a potential pickup of the resistance means; the diode means being connected between the first resistor part and the second supply potential; and the second resistor part being connected to the first supply potential.

In accordance with again an added feature of the invention, the integrated buffer circuit includes means for generating the reference potential, the generating means comprising first and second resistors and diode means; the first and second resistors being mutually connected with one another and the gate of the MOS-transistor; the diode means being connected between the first resistor and the second supply potential; and the second resistor being connected to the first supply potential.

In accordance with again another feature of the invention, the diode means are in the form of a transistor switched as a diode.

In accordance with again an additional feature of the invention, the diode means are in the form of at least one p-n junction diode.

In accordance with again further features of the invention, the integrated buffer includes a first capacitor connected between the gate of the MOS-transistor and the first supply potential, and/or a second capacitor connected between the input of the first inverter and the gate of the MOS-transistor. Either one or both of the first and second capacitors are an MOS varactor or a varactor circuit.

In accordance with yet another feature of the invention, the integrated buffer circuit includes a first hysteresis transistor having a channel path connected between the circuit node and the first supply potential, and having a gate connected to the output of the second inverter, and/or it includes a second hysteresis transistor having a channel path connected between the circuit node and the second supply potential, and having a gate connected to the output of the second inverter.

In accordance with yet an added feature of the invention, the first hysteresis transistor is an n-channel transistor and the second hysteresis transistor is a p-channel transistor.

In accordance with yet an additional feature of the invention, the first hysteresis transistor has a saturation current less than a current of the constant current source.

In accordance with yet a further feature of the invention, the hysteresis transistor has a channel with a channel width and channel length, the channel length and the channel width having a ratio being less than a ratio of a channel width to a channel length of a channel of the first transistor of the first inverter.

Again in accordance with another feature of the invention, the first and second enable transistors are of mutually opposite channel types.

In accordance with a concomitant feature of the invention, the first and second enable transistors are of the same channel type, and the circuit includes a third inverter connected between the enable input and a gate of one of the first and second enable transistors.

Other features which are considered as characteristic for the invention are set forth in the appended claims.

Although the invention is illustrated and described herein as embodied in an integrated buffer circuit, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS

Figure 1:
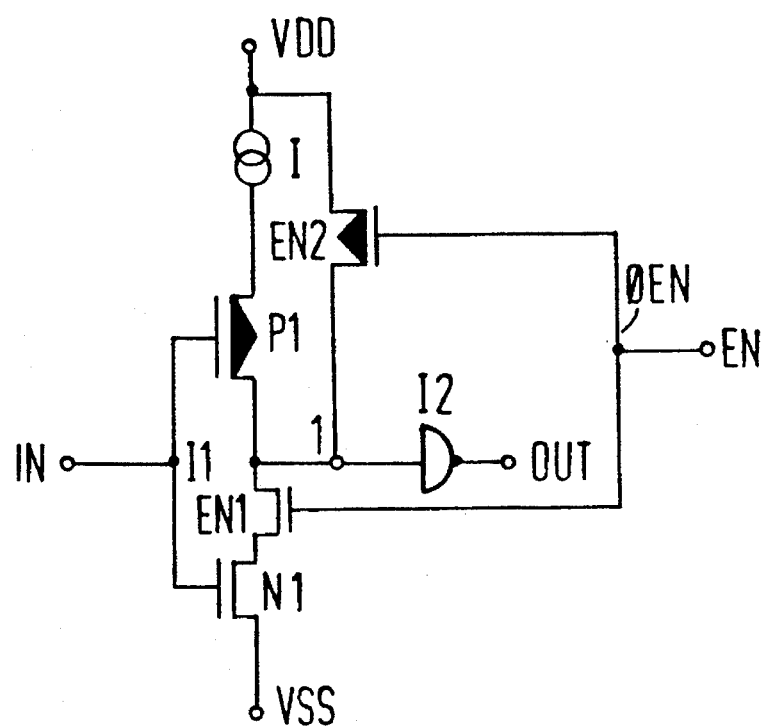
FIGS. 1–7 are schematic circuit diagrams of various embodiments of the circuit according to the invention.

Referring now to the figures of the drawing in detail and first, particularly, to FIG. 1 thereof, there are seen first and second inverters I1 and I2, which follow one another. The first inverter I1 is a CMOS inverter with an n-channel transistor N1 and a p-channel transistor P1, which are mutually connected in series. In operation, an input signal IN is present at the first inverter, via the gates of the transistors N1 and P1. The input signal may have either TTL levels or CMOS levels. In operation, an output signal OUT of the buffer circuit is present at the output of the second inverter I2, which is preferably also a CMOS inverter. The two inverters I1 and I2 are connected to one another via a circuit node 1 and via a first enable transistor EN1. The source of the one transistor N1 of the first inverter I1 is connected to a first supply potential VSS (typically equal to 0 V). The source of the other transistor P1 of the first inverter I1 is connected to a constant current source I. The first enable transistor EN1 is connected between the circuit node 1 and the n-channel transistor N1 of the first inverter I1. A second enable transistor EN2 is connected in parallel to the arrangement comprising the constant current source I and the p-channel transistor P1 of the first inverter I1. The gates of the two enable transistors EN1 and EN2 are connected jointly to an enable input EN of the buffer circuit. An enable signal ØEN can be applied to the enable input EN during operation.

Figure 10:
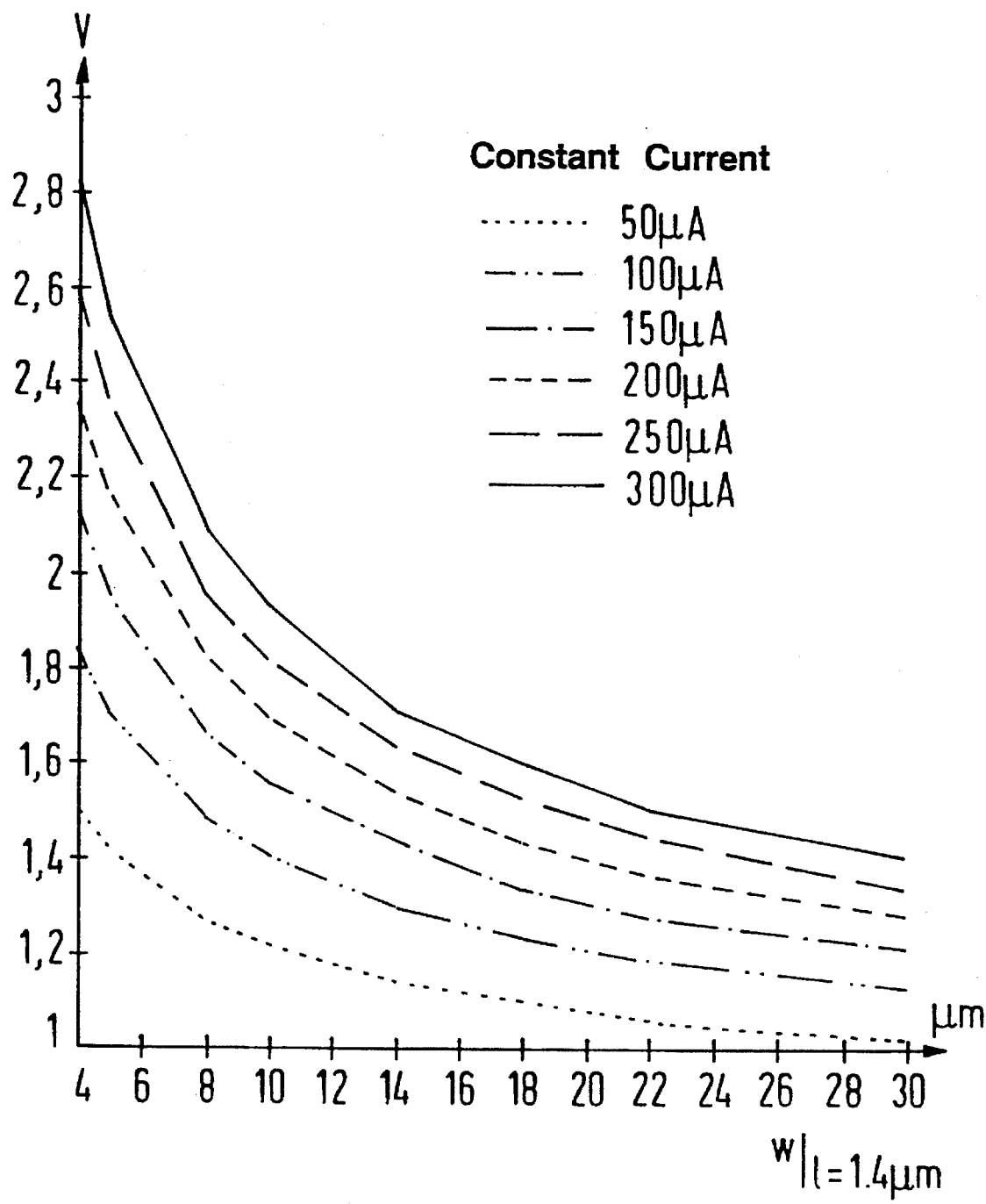
FIG. 10 is a diagrammatic representation of exemplary dimensions.

The switchover point of the first inverter I1 is defined as a function of the value of the current of the constant current source I, by means of suitable dimensioning of the transistor N1 of this inverter, with the first enable transistor EN1 conducting and the second enable transistor EN2 blocked. FIG. 10 shows examples of resultant switchover points (unit of measurement on the ordinate: Volt). If the channel width of the transistor N is varied (unit of measurement on the abscissa: µm), indicating various current intensities of the constant current source I (unit of measurement: µA) as parameters, and assuming that the channel length of the transistor N1 is always constant at 1.4 µm. Because the first inverter I1 is a CMOS inverter, its switchover point is determined within very narrow limits.

With the first enable transistor EN1 conducting and the second enable transistor EN2 blocked, because of the connection of the p-channel transistor P1 of the first inverter I1 with the constant current source I, the buffer circuit is very insensitive to interference and voltage fluctuations in the second supply potential VDD that serves as the supply source for the constant current source I. Because of the definition of the switchover point of the first inverter I1 within very narrow limits, the buffer circuit is likewise insensitive to interference in the input signal IN.

The two enable transistors EN1, EN2 contribute by means of the enable signal ØEN to a further reduction in the sensitivity to interference: During operation, the enable signal ØEN normally has an activated first logical level (in the exemplary embodiment of FIG. 1, in which the first enable transistor EN1 is of the n-channel type and the second enable transistor EN2 is of the p-channel type, this is a logic high level), in which the first enable transistor EN1 is made electrically conducting and the second enable transistor EN2 is electrically blocked. In that case, a signal determined by the input signal IN and the dimensioning of the first inverter I1 and by the dimensioning of the constant current source I is present at the circuit node 1 and by means of the second inverter I2 it reaches the output of the buffer circuit in the form of the output signal OUT.

When it is known that at certain times especially intensive interference can be expected (for instance, in the case of an integrated semiconductor memory containing the buffer circuit of the invention and having an address multiplexing device which is controlled by an address takeover signal $\overline{RAS}$, this address takeover signal $\overline{RAS}$ causes especially great interference on the semiconductor chip when its level state changes), then the enable signal ØEN may be applied to the enable input EN with a course over time such that at times at which such interference can be expected, it has an inactivated, second logic level (in the embodiment of FIG. 1, this is a low level), while otherwise it has the activated, first logic level. Given an inactivated level, the first enable transistor EN1 is then blocked independently of the input signal IN of the buffer circuit, while the second enable signal EN2 is made electrically conducting, so that the effects of the constant current source I and of the first inverter I1 are eliminated. In that case, a level establishes itself at the circuit node 1 which has the value of the second supply potential VDD, and as a result the output signal OUT assumes a low level. It is assumed here that as a result of the low level of the output signal OUT, other circuit elements of an integrated circuit that includes the buffer circuit of the invention, these other circuit elements being connected to the output side of the buffer circuit, are switched to be inactive.

Figure 2:
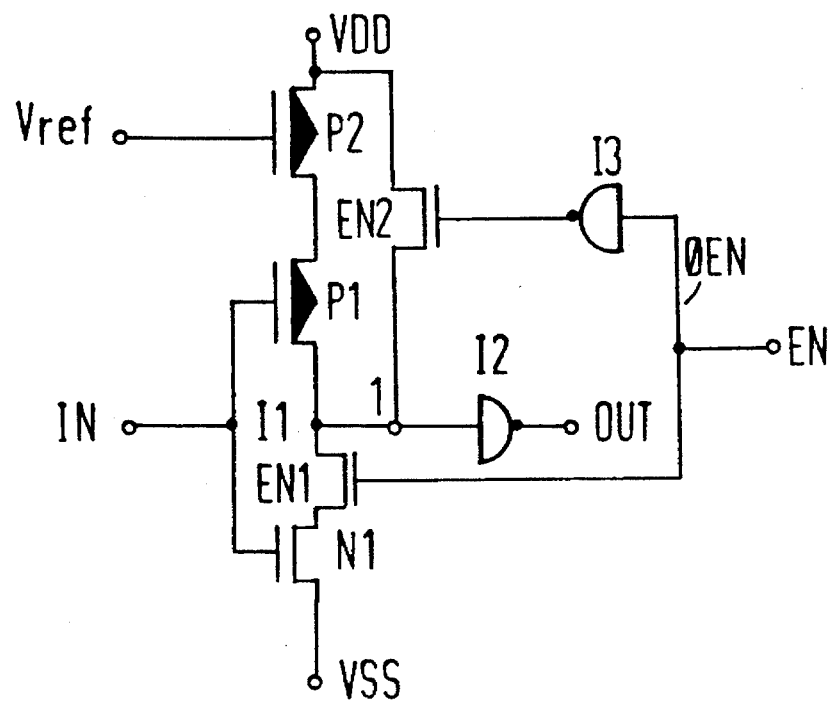

FIG. 2 shows an advantageous feature of the embodiment of FIG. 1. In FIG. 2, the constant current source I has an MOS-transistor P2 of the p-channel type. Its channel path is connected between the source of the other transistor P1 of the first inverter I1 and the second supply potential VDD. At its gate during operation, a reference potential $V_{ref}$ is present, which has a constant value relative to the value of the second supply potential VDD. If the value of the second supply potential VDD decreases in operation by an amount $\Delta VDD$, then the reference potential $V_{ref}$ decreases by the same amount $\Delta VDD$. If the value of the second supply potential VDD increases in operation by an amount $\Delta VDD$, then the reference potential $V_{ref}$ increases by the same amount $\Delta VDD$. The value of the reference potential $V_{ref}$ is dimensioned such that the MOS-transistor P2 is electrically conducting when the second enable transistor EN2 is blocked. The voltage $U_{GS}$ between the gate and source of the MOS-transistor P2 is constant, in accordance with what has been said above. Accordingly, during operation, a constant flow $I_{DS}$ flows along the channel path of the MOS-transistor P2; this transistor accordingly acts as a constant current source I.

FIG. 2 also shows a further embodiment of the enable transistors EN1 and EN2: while in the embodiment of FIG. 1 the enable transistors EN1, EN2 are of opposite channel types (first enable transistor EN1: n-channel type, second enable transistor EN2: p-channel type), in the embodiment of FIG. 2 they are of the same channel type, namely the n-channel type. Moreover, a third inverter I3 is disposed between the enable input EN and the gate of the second enable transistor EN2, so that the second enable transistor EN2 of FIG. 2 has the same switching behavior, with respect to the enable signal ØEN, as the second enable transistor EN2 of FIG. 1.

Figure 3:
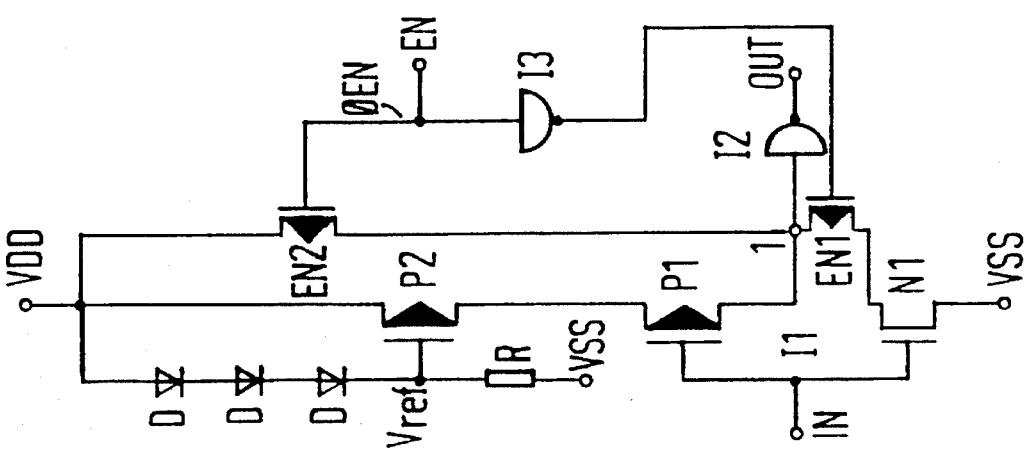

The embodiment of FIG. 3 shows a feature corresponding to FIG. 2, but expanded by a device for generating the reference potential $V_{ref}$ and with enable transistors EN1, EN2 of the p-channel type. Because the switching behavior of the enable transistors EN1 and EN2 of FIG. 3 is opposite that of the enable transistors EN1 and EN2 of FIG. 2, the third inverter I3 mentioned in connection with FIG. 2 is disposed in FIG. 3 between the enable input EN and the gate of the first enable transistor EN1.

The device for generating the reference potential $V_{ref}$ of FIG. 3 includes three series-connected diodes D (at least one diode is provided in accordance with the invention), which are disposed between the second supply potential VDD and the gate of the MOS-transistor P2, and a resistance R provided between the gate of the MOS-transistor P2 and the first supply potential VSS. Naturally the resistance R may be provided by a resistor or a resistor network having a plurality of (series- and/or parallel-connected) resistors.

The resistance of the resistor R is dimensioned (e.g. 250 kΩ) such that in the on state with respect to the input signal IN and when the first logic level of the enable signal ØEN is activated, a smallest possible current flows between the second supply potential VDD and the first supply potential VSS (via the diodes D). By way of example it may be embodied as an implantation resistor or in the form of a high-impedance polysilicon line, or as an MOS-transistor with high channel resistance. In this way, the reference potential $V_{ref}$ always exhibits the same difference from the second supply potential VDD, namely the sum $\Sigma V_{thD}$ of the diode voltages drops (flow voltages) $V_{thD}$ of the various diodes D.

In the embodiment of FIG. 3, the diodes D are p-n junction diodes. Such p-n junction diodes are known to exhibit a certain amount of temperature dependence which, however, does not disturb in most applications of the buffer circuit according to the invention.

Figure 5:
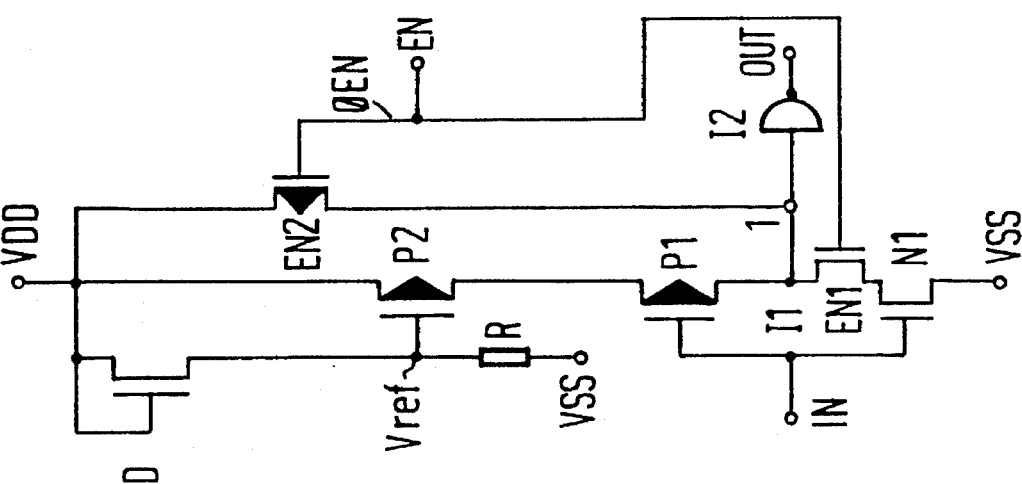
Figure 4:
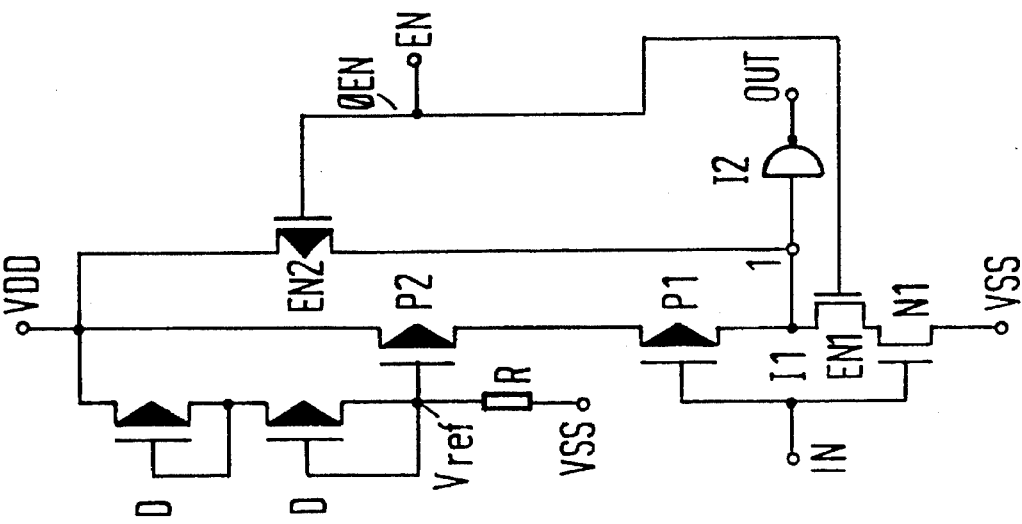

In the embodiment of FIG. 4, the diodes D are transistors switched as diodes (unlike FIG. 3, only two diodes D are shown). The transistors D are of the p-channel type. The enable transistors EN1 and EN2 are also of opposite channel types as in the embodiment of FIG. 1. FIG. 5, instead of the three diodes D of FIG. 3 or the two diodes D of FIG. 4, shows a single diode D in the form of an n-channel transistor switched as a diode.

To embody the buffer circuit of the invention within an integrated semiconductor circuit, it is especially favorable to provide the diodes D as p-channel transistors switched as diodes. Compared with the other two embodiments (n-channel transistors as diodes, or p-n junction diodes) this has the advantage that production variations in the MOS-transistor P2 (fluctuations caused by technology and temperature dependency) are automatically compensated for in manufacture by the p-channel transistors switched as diodes D.

Figure 6:
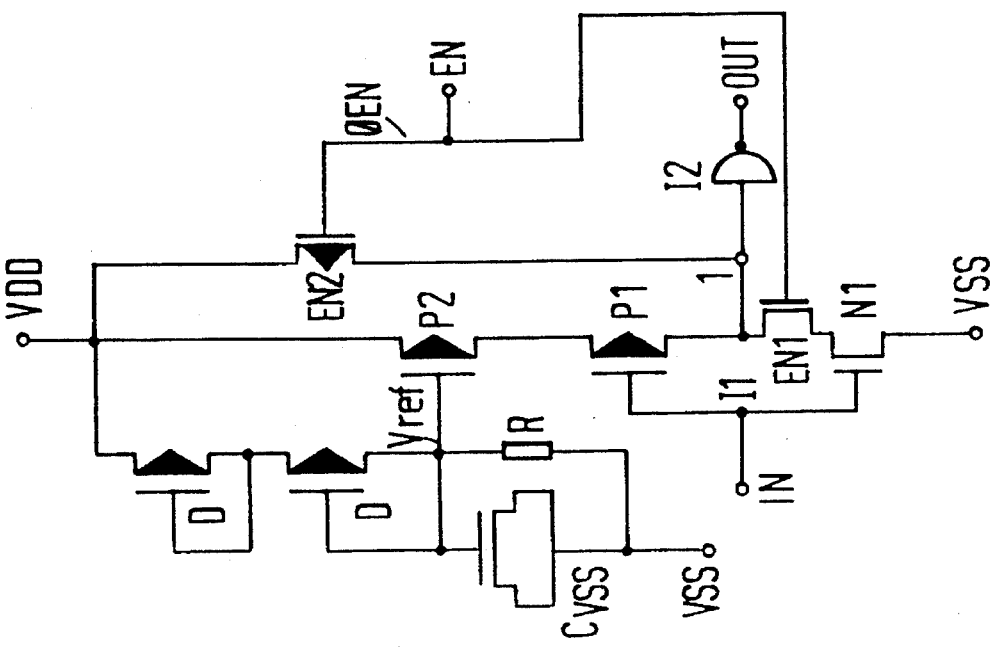

The refinement of FIG. 6 is based on the embodiment of FIG. 4. It includes in addition a first capacitor $C_{VSS}$, which is disposed between the gate of the MOS-transistor P2 and the first supply potential VSS. This has the advantage that interference in the first supply potential VSS (which is typically common reference potential at 0 V), which under unfavorable conditions can detract from the switching performance of the transistor N1 of the first inverter I1 (influencing the gate-to-source voltage $U_{GS}$ of this transistor N1) are largely suppressed by the capacitive coupling of the reference potential $V_{ref}$ to the first supply potential VSS (and hence to the source of the transistors N1 of the first inverter I1), because the capacitive coupling brings about a reduction of the channel current $I_{DS}$ in the MOS-transistor P2, which in turn overcomes the influence on the transistor N1 of the first inverter I1. The first capacitor $C_{VSS}$ is especially important whenever the input signal IN has TTL levels. At a high level of 2.4 V on the part of the input signal IN, both transistors N1 and P1 of the first inverter I1 are in fact electrically conducting (assume, for example, supply potentials of VSS=0 V and VDD =5 V). Conversely, if the input signal IN has CMOS levels, then the first capacitor $C_{VSS}$ can be omitted entirely without impairing the function of the buffer circuit, because then the low level of the input signal IN is generally equal to the value of the first supply potential VSS and the high level is equal to the second supply potential VDD. It may also be omitted when input signals IN have TTL levels, as long as it is assured with other provisions that the first supply potential VSS can exhibit at most minimal interference.

Figure 7:
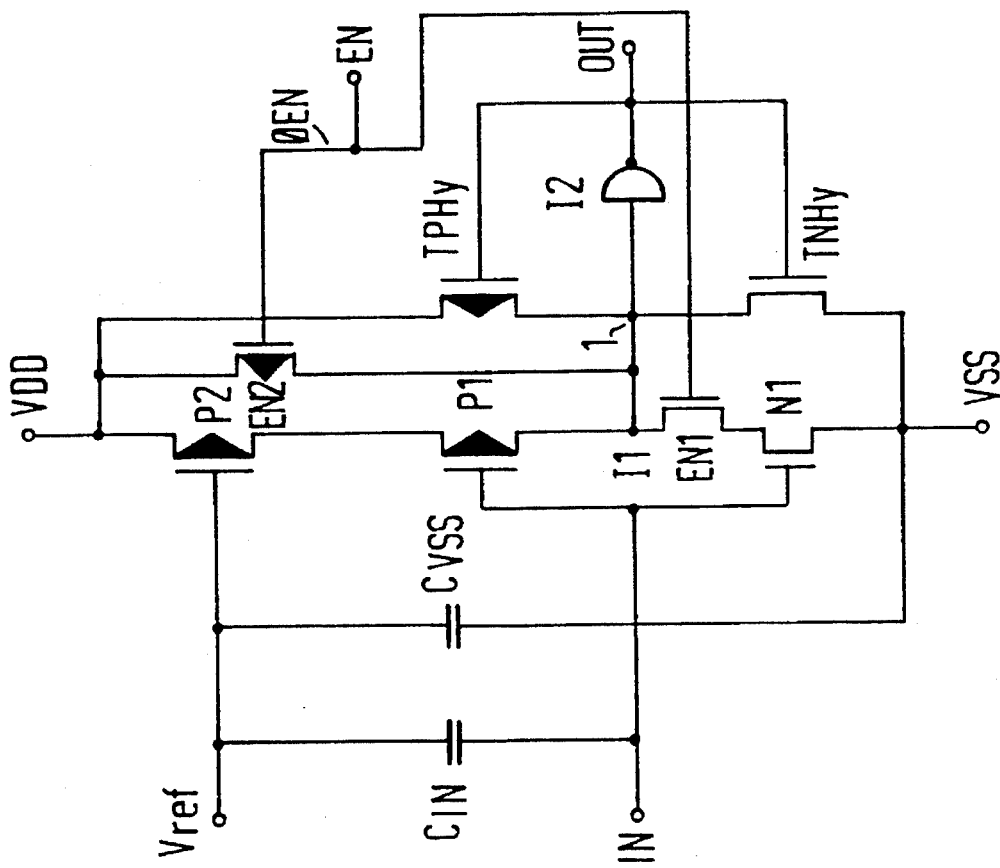

The refinement of FIG. 7 shows still other advantageous provisions beyond the embodiment of FIG. 6, namely by optimizing the operation of the buffer circuit according to the invention. First, a second capacitor $C_{IN}$ is provided, which is disposed between the gate of the MOS-transistor P2 and the input of the first inverter I1. This brings about a capacitive coupling between the reference potential $V_{ref}$ and the input signal IN and (given an activated ENABLE SIGNAL ØEN) results in shorter switching times of the first inverter I1 as compared to the embodiment of FIG. 5. Either one of the two capacitors $C_{VSS}$, $C_{IN}$ or both capacitors $C_{VSS}$, $C_{IN}$ may be embodied as MOS varactors, in other words, transistors whose source and drain are electrically connected to one another.

If the first inverter I1 is to be dimensioned with respect to its switchover point such that (given an activated enable signal ØEN) a relatively slow transition from the high to the low state (or vice versa) takes place at its output, that is, at the circuit node 1, then the result, for level values at the circuit node 1 that are in the vicinity of the switchover point of the second inverter I2, is that the second inverter I2 switches often briefly back and forth between low and high (or vice versa). This is undesirable. This undesirable switching behavior may also be due to interference in the input signal IN and/or in the first supply potential VSS.

In the circuit of FIG. 7, hysteresis transistors TNHy and TPHy are therefore provided. The first hysteresis transistor TNHy is disposed with its channel path between the first supply potential VSS and the circuit node 1. Its gate is connected to the output of the buffer circuit. The output signal OUT is accordingly present at the TNHy gate during operation. TNHy is of the n-channel type. The second hysteresis transistor TPHy is disposed with its channel path between the second supply potential VDD and the circuit node 1. Its gate is also connected to the output of the buffer circuit. The output signal OUT is accordingly present at the TPHy gate during operation as well. TPHy is of the p-channel type.

It is thereby advantageous if the saturation current of the first hysteresis transistor TNHy is lower than the current of the constant current source I (advantageously amounting to a maximum of 30% of the current of the constant current source I), and if the ratio between the channel width and the channel length (w/l) of the second hysteresis transistor TPHy is less than the corresponding ratio of the channel width over the channel length of the transistor N1 of the first inverter I1 (advantageously it amounts to a maximum of 30% of the value for the transistor N1).

The function of the hysteresis transistors TNHy and TPHy will now be described with reference to the diagram of FIG. 8, assuming that the enable signal ØEN is at its activated, first logic level. The values of the input signal IN are plotted in the form of curves over the values of the output signal OUT of the buffer circuit for various embodiments of the buffer circuit. The rise and fall of the input signal IN is represented by an arrow in the curves in each case.

A curve A (shown in dashed lines) illustrates the switching behavior of a buffer circuit according to the invention without hysteresis transistors TPHy and TNHy. The switchover points of the buffer circuit for the transitions from low to high and from high to low on the part of the output signal OUT are both located at a value $V_A$ of the input signal IN.

Figure 8:
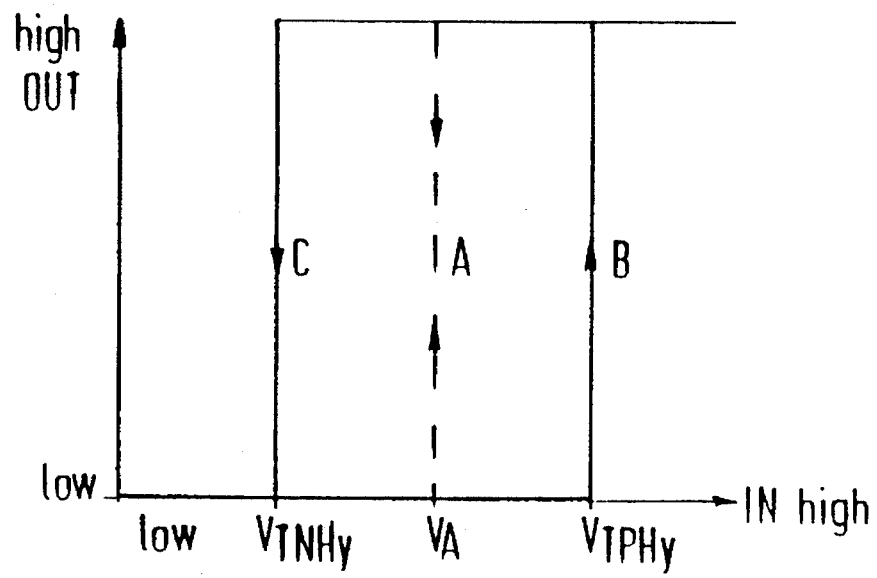
FIGS. 8 and 9 are schematic potential diagrams.

If major interference in the supply potentials VSS, VDD and/or in the input signal IN is to be expected which is so great that the interference can cause an undesirable transition of the output signal OUT from the low state to the high state (on the assumption that this interference cannot be predicted in terms of time, so that the deactivated second logic level cannot be assigned to the enable signal ØEN), then it is recommended that the second hysteresis transistor TPHy of FIG. 8 be provided (curves A and B). This has the effect that if the input signal IN rises, the output signal OUT does not assume its high value until a value of $V_{TPHy}$ (curve B) of the input signal IN that is higher than the value $V_A$ of the input signal IN of a buffer circuit without this hysteresis transistor (for example, 0.1 to 0.4 V higher). For a rise in the value of the input signal IN (arrow in curve B), the switchover point of the buffer circuit is accordingly shifted in the direction of higher values of the input signal IN. If the value of the input signal IN is dropping (arrow downward in curve A) from high toward low, the switchover point of the buffer circuit remains unchanged at the value $V_A$ of the input signal IN (corresponding to a buffer circuit without hysteresis transistors).

If conversely (also not foreseeable in terms of time, as explained supra) major interference in the supply potentials VSS, VDD and/or in the input signal IN is to be expected which is so great that the interference can cause an undesirable transition of the output signal OUT from the high state to the low state, then it is recommended that the first hysteresis transistor TNHy be provided (curves A and C). This has the effect that if the input signal IN rises, the output signal OUT maintains its high value unchanged at the value $V_A$ (arrow pointing upward in curve A; corresponds to a buffer circuit without hysteresis transistors) of the input signal IN. If the value of the input signal IN is dropping (arrow downward in curve C) from high toward low, however, then the switchover point of the buffer circuit is shifted to a value $V_{TNHy}$ in the direction of lower values of the input signal IN (shifted downward by 0.1 to 0.4 V, for example).

However, if interference that can cause undesired transitions of the output signal OUT both at the transition from the high state to the low state and vice versa can be expected, then it is advantageous to use both hysteresis transistors TNHy and TPHy, as shown in FIG. 7 (curves B and C in FIG. 8). This has the effect that if the input signal IN rises, the output signal OUT will not assume its high value until at the value of $V_{TpHy}$ signal IN that is higher than the value $V_A$ of the input signal IN of a buffer circuit without hysteresis transistors (for example, 0.1 to 0.4 V higher). For a rise in the value of the input signal IN (arrow in curve B), the switchover point of the buffer circuit is accordingly shifted in the direction of higher values of the input signal IN. Likewise, if the value of the input signal IN is dropping (arrow downward in curve C) from high toward low, the switchover point of the buffer circuit is shifted to the value $V_{TNHy}$ in the direction of lower values of the input signal IN, compared to a buffer circuit without hysteresis transistors (being shifted downward by 0.1 to 0.4 V, for example).

Figure 9:
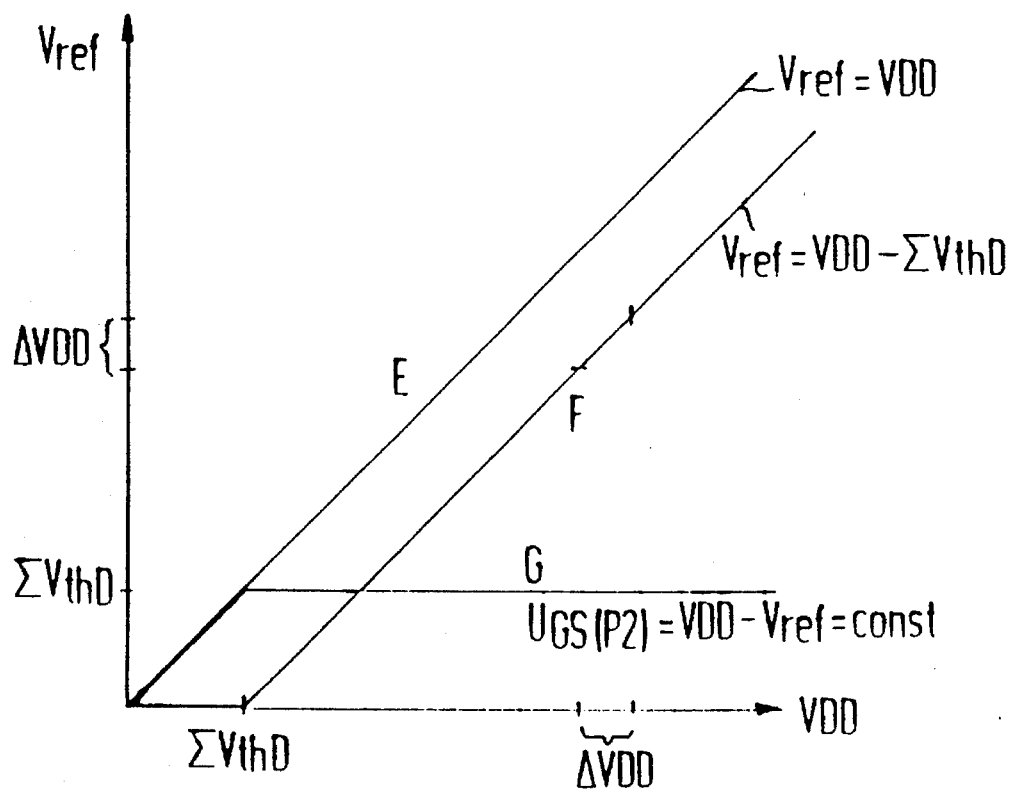

FIG. 9 shows the value of the reference potential $V_{ref}$ of the buffer circuits for diodes D of FIGS. 3–6, plotted over the second supply potential VDD (curve F). In the embodiments of FIGS. 2 and 7, its course is qualitatively identical; merely in its quantitative course is it possibly different, since in the embodiments of FIGS. 2–7, no diodes are shown.

A curve E illustrates the hypothetical course of a reference potential $V'_{ref}$, which would result from a condition $V'_{ref}=$ VDD. In accordance with the present teaching, this case is in fact precluded because the buffer circuit would not function since the MOS-transistor P2 would always be in the blocked state. Curve E serves merely to make a clearer illustration of the course of curve F: Curve F shows the actual course of the reference potential $V_{ref}$ over the second supply potential VDD.

When the buffer circuit is first turned, the second supply potential VDD rises up to a value that is equivalent to the sum $\Sigma V_{thD}$ of all the voltages drops across the diodes D. Up to that point, the value of the reference potential $V_{ref}$ is always 0 V. The gate-to-source voltage $U_{GS(P2)}$ at the MOS-transistor P2 (represented in curve G) rises, parallel to the rise of the second supply potential VDD, up to the value $\Sigma V_{thD}$. If now, in the further course, the second supply potential VDD exceeds this summation value $\Sigma V_{thD}$, then the reference potential $V_{ref}$ rises, with a value that is always equal to the simultaneous value of the second supply potential VDD, minus the summation value $\Sigma V_{thD}$, so that the following equation always applies: $V_{ref}=VDD-\Sigma V_{thD}$. Accordingly, for this range, the following equation always applies for the gate-to-source voltage $U_{GS(P2)}$ at the MOS-transistor P2:

$$U_{GS(P2)}=VDD-V_{ref}=VDD-(VDD-\Sigma V_{thD})=V_{thD}.$$

This value is constant. If now, as provided in accordance with the invention, the summation value $\Sigma V_{thD} \geq$ the value of the operating voltage $V_{th(P2)}$ of the MOS-transistor P2, then a constant flow $I_{DS}$ also flows over the channel path of the MOS-transistor P2; the MOS-transistor P2 functions as a constant current source I.

FIG. 9 also illustrates that in the case when the value of second supply potential VDD changes by an amount $\Delta$VDD (for example from a voltage breakdown, or as shown upon the rise of the second supply potential VDD), the value of the reference potential $V_{ref}$ varies by this same amount $\Delta$VDD.

Figure 11:
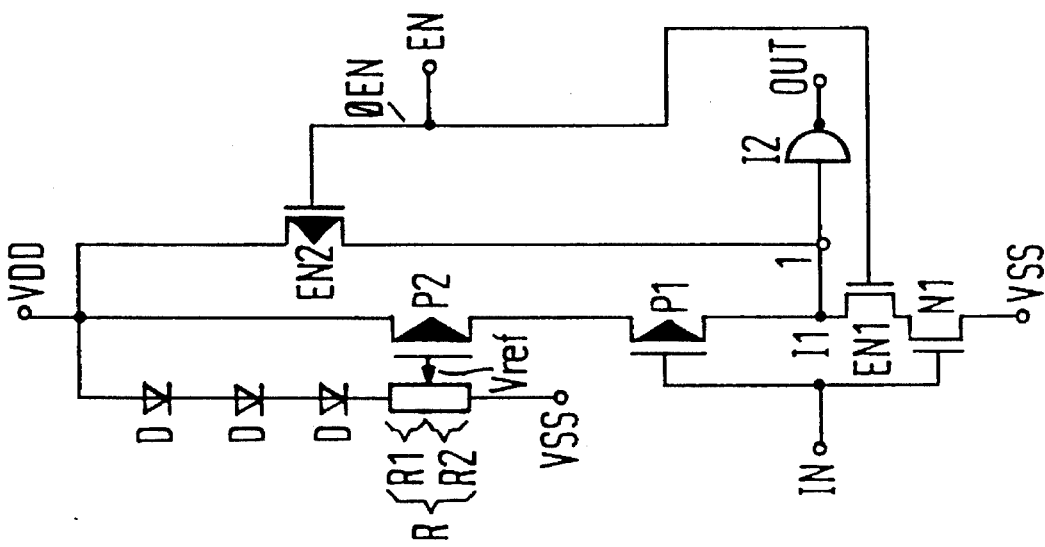

FIG. 11 shows a further advantageous embodiment of the buffer circuit of the invention. It is based on the embodiment of FIG. 3, with the following changes: first, the two enable transistors EN1 are EN2 are complementary of opposite channel types, as already described in conjunction with FIG. 1. Second, the resistance R is not connected between the gate of the MOS-transistor P2 and the first supply potential VSS (as in FIG. 3), but rather between the diodes D and the first supply potential VSS. The resistor R is embodied in the manner of a potentiometer, with a resistance pickup that is connected to the gate of the MOS-transistor P2. The resistor R is thus functionally split into two resistor components R1, R2. The first resistor component R1 is disposed between the diodes and the resistance pickup connected to the gate of the MOS-transistor P2, while the second resistor component R2 is disposed between this resistance pickup and the first supply potential VSS.

With this configuration, and by suitable positioning of the resistance pickup at the resistor R, the desired value of the reference potential $V_{ref}$ can be adjusted more accurately than solely by selecting a suitable number of diodes D with their diode voltage drops $V_{thD}$.

Figure 12:
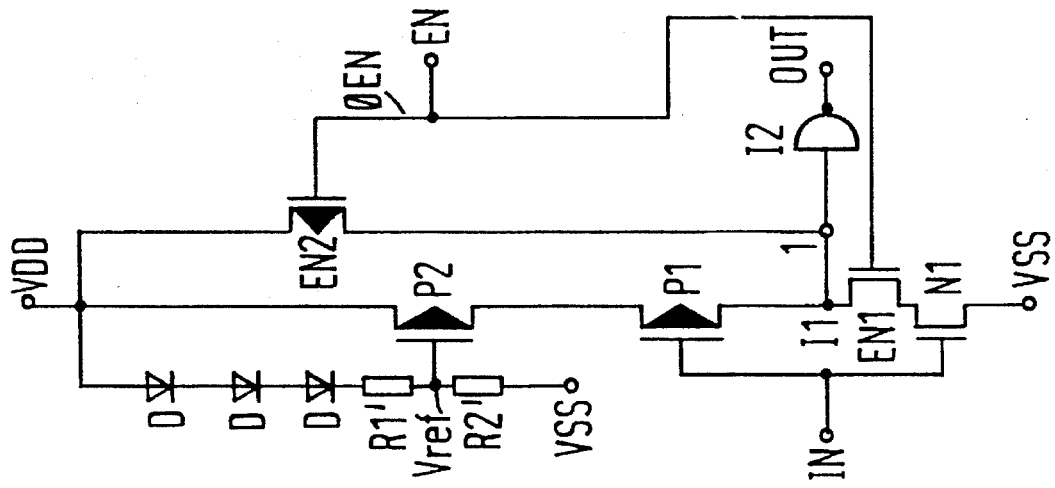
FIG. 11 and 12 are circuit diagrams of further embodiments of the circuit configuration of the invention.

With reference to FIG. 12, a technically equivalent version is obtained if instead of the resistance R with its two resistor components R1, R2, at least two separate resistors R1', R2', mutually connected in series, were provided; the first resistor R1' is then disposed between the diodes D and the gate of the MOS-transistor P2, while the other resistor R2' is disposed between the gate of the MOS-transistor P2 and the first supply potential VSS.

We claim:

1. An integrated buffer circuit, comprising:

a first inverter having an input for receiving an input signal, and a constant current source;

a second inverter connected in cascade with said first inverter, said second inverter having an output issuing an output signal of the buffer circuit, and a circuit node connected between said first and second inverters;

said first inverter being a CMOS-inverter including first and second transistors, said first and second transistors being connected in series across said circuit node and being of a mutually opposite channel type;

said first and second transistors of said first inverter having electrically connected gates forming said input of said first inverter;

said first transistor of said first inverter having a source connected to a first supply potential;

said second transistor of said first inverter having a source connected to said constant current source;

said first transistor having a drain; a first enable transistor having a current-carrying path connected between said drain of said first transistor and said circuit node;

a second enable transistor having a current-carrying path connected in parallel to a path formed by said constant current source and said second transistor of said first inverter;

an enable input of the buffer circuit, said gates of said first and second enable transistors being connected to said enable input, wherein said constant current source includes an MOS-transistor connected between said source of said second transistor of said first inverter and a second supply potential, said MOS-transistor being electrically conductive during an operation of the buffer circuit and having a gate receiving a reference potential during an operation of the buffer circuit, said reference potential having a value different from said second supply potential by a constant amount; and means for generating said reference potential, said generating means including resistance means and diode means; said resistance means being a potentiometer-type resistor having a first resistor part and a second resistor part;

said first and second resistor parts, at ends facing one another, being connected to said gate of said MOS-transistor and forming a potential pickup of said resistance means;

said diode means being connected between said first resistor part and said second supply potential; and said second resistor part being connected to said first supply potential.

2. The integrated buffer circuit according to claim 1, wherein said diode means are one of a transistor switched as a diode and a p-n junction diode.

3. The integrated buffer circuit according to claim 1, including a capacitor connected between said gate of said MOS-transistor and said first supply potential.

4. The integrated buffer circuit according to claim 1, wherein said first and second enable transistors are of mutually opposite channel types.

5. An integrated buffer circuit, comprising:

a first inverter having an input for receiving an input signal, and a constant current source;

a second inverter connected in cascade with said first inverter, said second inverter having an output issuing an output signal of the buffer circuit, and a circuit node connected between said first and second inverters;

said first inverter being a CMOS-inverter including first and second transistors, said first and second transistors being connected in series across said circuit node and being of a mutually opposite channel type;

said first and second transistors of said first inverter having electrically connected gates forming said input of said first inverter;

said first transistor of said first inverter having a source connected to a first supply potential;

said second transistor of said first inverter having a source connected to said constant current source;

said first transistor having a drain; a first enable transistor having a current-carrying path connected between said drain of said first transistor and said circuit node;

a second enable transistor having a current-carrying path connected in parallel to a path formed by said constant current source and said second transistor of said first inverter;

an enable input of the buffer circuit, said gates of said first and second enable transistors being connected to said enable input, wherein said constant current source includes an MOS- transistor connected between said source of said second transistor of said first inverter and a second supply potential, said MOS-transistor being electrically conductive during an operation of the buffer circuit and having a gate receiving a reference potential during an operation of the buffer circuit, said reference potential having a value different from said second supply potential by a constant amount; and means for generating said reference potential, said generating means comprising first and second resistors and diode means;

said first and second resistors being mutually connected with one another and said gate of said MOS-transistor;

said diode means being connected between said first resistor and said second supply potential; and said second resistor being connected to said first supply potential.

6. The integrated buffer circuit according to claim 5, wherein said diode means are one of a transistor switched as a diode and a p-n junction diode.

7. The integrated buffer circuit according to claim 5, wherein said first and second enable transistors are of mutually opposite channel types.

8. The integrated buffer circuit according to claim 5, including a capacitor connected between said gate of said MOS-transistor and said first supply potential.

9. An integrated buffer circuit, comprising:

a first inverter having an input for receiving an input signal, and a constant current source;

a second inverter connected in cascade with said first inverter, said second inverter having an output issuing an output signal of the buffer circuit, and a circuit node connected between said first and second inverters;

said first inverter being a CMOS-inverter including first and second transistors, said first and second transistors being connected in series across said circuit node and being of a mutually opposite channel type;

said first and second transistors of said first inverter having electrically connected gates forming said input of said first inverter;

said first transistor of said first inverter having a source connected to a first supply potential;

said second transistor of said first inverter having a source connected to said constant current source;

said first transistor having a drain; a first enable transistor having a current-carrying path connected between said drain of said first transistor and said circuit node;

a second enable transistor having a current-carrying path connected in parallel to a path formed by said constant current source and said second transistor of said first inverter;

an enable input of the buffer circuit, said gates of said first and second enable transistors being connected to said enable input, wherein said constant current source includes an MOS- transistor connected between said source of said second transistor of said first inverter and a second supply potential, said MOS-transistor being electrically conductive during an operation of the buffer circuit and having a gate receiving a reference potential during an operation of the buffer circuit, said reference potential having a value different from said second supply potential by a constant amount; and a capacitor connected between said input of said first inverter and said gate of said MOS-transistor.

10. The integrated buffer circuit according to claim 9, wherein said first and second enable transistors are of mutually opposite channel types.

11. The integrated buffer circuit according to claim 9, including a capacitor connected between said gate of said MOS-transistor and said first supply potential.

12. An integrated buffer circuit, comprising:

a first inverter having an input for receiving an input signal, and a constant current source;

a second inverter connected in cascade with said first inverter, said second inverter having an output issuing an output signal of the buffer circuit, and a circuit node connected between said first and second inverters;

said first inverter being a CMOS-inverter including first and second transistors, said first and second transistors being connected in series across said circuit node and being of a mutually opposite channel type;

said first and second transistors of said first inverter having electrically connected gates forming said input of said first inverter;

said first transistor of said first inverter having a source connected to a first supply potential;

said second transistor of said first inverter having a source connected to said constant current source;

said first transistor having a drain; a first enable transistor having a current-carrying path connected between said drain of said first transistor and said circuit node;

a second enable transistor having a current-carrying path connected in parallel to a path formed by said constant current source and said second transistor of said first inverter;

an enable input of the buffer circuit, said gates of said first and second enable transistors being connected to said enable input, wherein said constant current source includes an MOS-transistor connected between said source of said second transistor of said first inverter and a second supply potential, said MOS-transistor being electrically conductive during an operation of the buffer circuit and having a gate receiving a reference potential during an operation of the buffer circuit, said reference potential having a value different from said second supply potential by a constant amount; and a first capacitor connected between said gate of said MOS-transistor and said first supply potential, and a second capacitor connected between said input of said first inverter and said gate of said MOS-transistor.

13. The integrated buffer circuit according to claim 12, wherein at least one of said first and second capacitors is an MOS varactor.

14. The integrated buffer circuit according to claim 12, wherein said first and second enable transistors are of mutually opposite channel types.

15. The integrated buffer circuit according to claim 12, including a capacitor connected between said gate of said MOS-transistor and said first supply potential.

16. An integrated buffer circuit, comprising:

a first inverter having an input for receiving an input signal, and a constant current source;

a second inverter connected in cascade with said first inverter, said second inverter having an output issuing an output signal of the buffer circuit, and a circuit node connected between said first and second inverters;

said first inverter being a CMOS-inverter including first and second transistors, said first and second transistors being connected in series across said circuit node and being of a mutually opposite channel type;

said first and second transistors of said first inverter having electrically connected gates forming said input of said first inverter;

said first transistor of said first inverter having a source connected to a first supply potential;

said second transistor of said first inverter having a source connected to said constant current source;

said first transistor having a drain; a first enable transistor having a current-carrying path connected between said drain of said first transistor and said circuit node;

a second enable transistor having a current-carrying path connected in parallel to a path formed by said constant current source and said second transistor of said first inverter;

an enable input of the buffer circuit, said gates of said first and second enable transistors being connected to said enable input; and a hysteresis transistor having a channel path connected between said circuit node and said first supply potential, and having a gate connected to said output of said second inverter.

17. The integrated buffer circuit according to claim 16, wherein said hysteresis transistor is an n-channel transistor.

18. The integrated buffer circuit according to claim 16, wherein said hysteresis transistor has a saturation current less than a current of said constant current source.

19. The integrated buffer circuit according to claim 16, wherein said first and second enable transistors are of mutually opposite channel types.

20. The integrated buffer circuit according to claim 16, including a capacitor connected between said gate of said MOS-transistor and said first supply potential.

21. An integrated buffer circuit, comprising:

a first inverter having an input for receiving an input signal, and a constant current source;

a second inverter connected in cascade with said first inverter, said second inverter having an output issuing an output signal of the buffer circuit, and a circuit node connected between said first and second inverters;

said first inverter being a CMOS-inverter including first and second transistors, said first and second transistors being connected in series across said circuit node and being of a mutually opposite channel type;

said first and second transistors of said first inverter having electrically connected gates forming said input of said first inverter;

said first transistor of said first inverter having a source connected to a first supply potential;

said second transistor of said first inverter having a source connected to said constant current source;

said first transistor having a drain; a first enable transistor having a current-carrying path connected between said drain of said first transistor and said circuit node;

a second enable transistor having a current-carrying path connected in parallel to a path formed by said constant current source and said second transistor of said first inverter;

an enable input of the buffer circuit, said gates of said first and second enable transistors being connected to said enable input, wherein said constant current source includes an MOS- transistor connected between said source of said second transistor of said first inverter and a second supply potential, said MOS-transistor being electrically conductive during an operation of the buffer circuit and having a gate receiving a reference potential during an operation of the buffer circuit, said reference potential having a value different from said second supply potential by a constant amount; and a hysteresis transistor having a channel path connected between said circuit node and said second supply potential, and having a gate connected to said output of said second inverter.

22. The integrated buffer circuit according to claim 21, wherein said hysteresis transistor is a p-channel transistor.

23. The integrated buffer circuit according to claim 21, wherein said hysteresis transistor has a channel with a channel width and channel length, said channel length and said channel width having a ratio being less than a ratio of a channel width to a channel length of a channel of said first transistor of said first inverter.

24. The integrated buffer circuit according to claim 21, wherein said first and second enable transistors are of mutually opposite channel types.

25. The integrated buffer circuit according to claim 21, including a capacitor connected between said gate of said MOS-transistor and said first supply potential.

26. An integrated buffer circuit, comprising:

a first inverter having an input for receiving an input signal, and a constant current source;

a second inverter connected in cascade with said first inverter, said second inverter having an output issuing an output signal of the buffer circuit, and a circuit node connected between said first and second inverters;

said first inverter being a CMOS-inverter including first and second transistors, said first and second transistors being connected in series across said circuit node and being of a mutually opposite channel type;

said first and second transistors of said first inverter having electrically connected gates forming said input of said first inverter;

said first transistor of said first inverter having a source connected to a first supply potential;

said second transistor of said first inverter having a source connected to said constant current source;

said first transistor having a drain; a first enable transistor having a current-carrying path connected between said drain of said first transistor and said circuit node;

a second enable transistor having a current-carrying path connected in parallel to a path formed by said constant current source and said second transistor of said first inverter;

an enable input of the buffer circuit, said gates of said first and second enable transistors being connected to said enable input; and a first hysteresis transistor having a channel path connected between said circuit node and said first supply potential, and having a gate connected to said output of said second inverter, and a second hysteresis transistor having a channel path connected between said circuit node and said second supply potential, and having a gate connected to said output of said second inverter.

27. The integrated buffer circuit according to claim 26, wherein said first hysteresis transistor is an n-channel transistor and said second hysteresis transistor is a p-channel transistor.

28. The integrated buffer circuit according to claim 26, wherein said first and second enable transistors are of mutually opposite channel types.

29. The integrated buffer circuit according to claim 26, including a capacitor connected between said gate of said MOS-transistor and said first supply potential.

30. An integrated buffer circuit, comprising:

a first inverter having an input for receiving an input signal, and a constant current source;

a second inverter connected in cascade with said first inverter, said second inverter having an output issuing an output signal of the buffer circuit, and a circuit node connected between said first and second inverters;

said first inverter being a CMOS-inverter including first and second transistors, said first and second transistors being connected in series across said circuit node and being of a mutually opposite channel type;

said first and second transistors of said first inverter having electrically connected gates forming said input of said first inverter;

said first transistor of said first inverter having a source connected to a first supply potential;

said second transistor of said first inverter having a source connected to said constant current source;

said first transistor having a drain; a first enable transistor having a current-carrying path connected between said drain of said first transistor and said circuit node;

a second enable transistor having a current-carrying path connected in parallel to a path formed by said constant current source and said second transistor of said first inverter;

an enable input of the buffer circuit, said gates of said first and second enable transistors being connected to said enable input; and wherein said first and second enable transistors are of the same channel type, and including a third inverter connected between said enable input and a gate of one of said first and second enable transistors.

31. The integrated buffer circuit according to claim 30, including a capacitor connected between said gate of said MOS-transistor and said first supply potential.

* * * * *